(12) United States Patent
Fan et al.

(10) Patent No.: US 9,929,049 B2
(45) Date of Patent: Mar. 27, 2018

(54) GATE TIE-DOWN ENABLEMENT WITH INNER SPACER

(71) Applicants: INTERNATIONAL BUSINESS MACHINES CORPORATION, Armonk, NY (US); GLOBALFOUNDRIES Inc., Grand Cayman (KY)

(72) Inventors: Su Chen Fan, Cohoes, NY (US); Andre P. Labonte, Mechanicville, NY (US); Lars W. Liebmann, Poughquag, NY (US); Sanjay C. Mehta, Niskayuna, NY (US)

(73) Assignees: INTERNATIONAL BUSINESS MACHINES CORPORATION, Armonk, NY (US); GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 15/699,322

(22) Filed: Sep. 8, 2017

(65) Prior Publication Data

US 2017/0372959 A1    Dec. 28, 2017

Related U.S. Application Data

(63) Continuation of application No. 15/443,523, filed on Feb. 27, 2017, which is a continuation of application
(Continued)

(51) Int. Cl.
*H01L 21/768* (2006.01)
*H01L 29/66* (2006.01)
(Continued)

(52) U.S. Cl.
CPC .... *H01L 21/76897* (2013.01); *H01L 21/0274* (2013.01); *H01L 21/31111* (2013.01);
(Continued)

(58) Field of Classification Search
CPC ........... H01L 21/0274; H01L 21/31111; H01L 21/76802; H01L 21/76805; H01L 21/7684;
(Continued)

(56) References Cited

U.S. PATENT DOCUMENTS 5,006,911 A    4/1991  Sivan
5,702,979 A    12/1997 Chan et al.
(Continued)

OTHER PUBLICATIONS

Anonymous, "SRAM memory interface to microcontroller in embedded systems," EE Herald, Retrieved May 2015. (pp. 1-8). Available at http://www.eeherald.com/section/design-guide/esmod15.html.
(Continued)

*Primary Examiner* — Allan R Wilson
(74) *Attorney, Agent, or Firm* — Tutunjian & Bitetto, P.C.; Vazken Alexanian

(57) ABSTRACT

A method for forming a gate tie-down includes opening up a cap layer and recessing gate spacers on a gate structure to expose a gate conductor; forming inner spacers on the gate spacers; etching contact openings adjacent to sides of the gate structure down to a substrate below the gate structures; and forming trench contacts on sides of the gate structure. An interlevel dielectric (ILD) is deposited on the gate conductor and the trench contacts and over the gate structure. The ILD is opened up to expose the trench contact on one side of the gate structure and the gate conductor. A second conductive material provides a self-aligned contact down to the trench contact on the one side and to form a gate contact down to the gate conductor and a horizontal con-
(Continued)

nection within the ILD over an active area between the gate conductor and the self-aligned contact.

20 Claims, 6 Drawing Sheets

Related U.S. Application Data

No. 15/175,776, filed on Jun. 7, 2016, now Pat. No. 9,735,054, which is a continuation of application No. 14/822,654, filed on Aug. 10, 2015, now Pat. No. 9,397,049.

(51) Int. Cl.
  H01L 23/522 (2006.01)
  H01L 23/528 (2006.01)
  H01L 21/311 (2006.01)
  H01L 27/11 (2006.01)
  H01L 23/535 (2006.01)
  H01L 21/027 (2006.01)

(52) U.S. Cl.
  CPC .... *H01L 21/7684* (2013.01); *H01L 21/76802* (2013.01); *H01L 21/76805* (2013.01); *H01L 21/76877* (2013.01); *H01L 21/76895* (2013.01); *H01L 23/528* (2013.01); *H01L 23/5226* (2013.01); *H01L 23/535* (2013.01); *H01L 27/1104* (2013.01); *H01L 29/665* (2013.01); *H01L 29/6656* (2013.01); *H01L 29/66515* (2013.01); *H01L 29/66545* (2013.01); *H01L 29/66553* (2013.01); *H01L 2924/0002* (2013.01)

(58) Field of Classification Search
  CPC ......... H01L 21/76877; H01L 21/76895; H01L 21/76897; H01L 23/5226; H01L 23/528; H01L 23/535; H01L 29/665; H01L 29/66515; H01L 29/66545; H01L 29/66553; H01L 29/6656
  See application file for complete search history.

(56) References Cited

U.S. PATENT DOCUMENTS

| | | | |
|---|---|---|---|
| 6,107,189 A | 8/2000 | Wald et al. | |
| 6,348,411 B1 | 2/2002 | Ireland et al. | |
| 7,718,513 B2 | 5/2010 | Zhu et al. | |
| 7,813,162 B2 | 10/2010 | Zhu et al. | |
| 8,802,520 B2 | 8/2014 | Tang et al. | |
| 9,490,317 B1* | 11/2016 | Labonte | H01L 29/78 |
| 2002/0102845 A1* | 8/2002 | Lee | H01L 21/26586 438/677 |
| 2006/0228852 A1 | 10/2006 | Chien et al. | |
| 2009/0039433 A1 | 2/2009 | Yang et al. | |
| 2011/0136309 A1 | 6/2011 | Grivna et al. | |
| 2014/0077305 A1* | 3/2014 | Pethe | H01L 21/76895 257/368 |
| 2014/0117438 A1 | 5/2014 | Meiser et al. | |
| 2015/0311082 A1 | 10/2015 | Bouche et al. | |
| 2016/0133623 A1* | 5/2016 | Xie | H01L 27/088 257/384 |
| 2016/0163532 A1* | 6/2016 | Lu | H01L 21/0206 438/695 |
| 2016/0300763 A1 | 10/2016 | Kim et al. | |
| 2017/0125520 A1* | 5/2017 | Siemieniec | H01L 29/0696 |
| 2017/0148799 A1 | 5/2017 | Basker et al. | |

OTHER PUBLICATIONS

Carmona, M. et al., "Study of gate contact over active area," 29th Symposium on Microelectronics Technology and Devices (SBMicro), Sep. 2014. (pp. 1-4).

Mishra, P. et al., "FinFET Circuit Design," Nanoelectronic Circuit Design, Nov. 2011. (pp. 23-54).

Park, J.C. et al., "Low Damage and Anisotropic Dry Etching of High-κ Dielectric HfO2 Films in Inductively Coupled Plasmas," Electronic Materials Letters, vol. 6 No. 3, Sep. 2010. (pp. 107-112).

Shin, C "Advanced MOSFET Designs and Implications for SRAM Scaling," Dissertation for the degree of Doctor of Philosophy in Engineering—Electrical Engineering and Computer Sciences at University of California, Berkeley, Spring 2011. (pp. 1-109).

Office Action issued in U.S. Appl. No. 15/432,372 dated Jul. 7, 2017, pp. 1-10.

Office Action issued in U.S. Appl. No. 15/175,835 dated Dec. 9, 2016, pp. 1-9.

Office Action issued in U.S. Appl. No. 15/618,880 dated Aug. 8, 2017, pp. 1-9.

List of IBM Patents or Patent Applications Treated as Related dated Sep. 8, 2017, 2 pages.

* cited by examiner

GATE TIE-DOWN ENABLEMENT WITH INNER SPACER

BACKGROUND

Technical Field

The present invention relates to semiconductor processing, and more particularly to a gate tie-down structure that permits gate contacts in active areas and self-aligns these gate contacts with source/drain contacts.

Description of the Related Art

In conventional complementary metal oxide semiconductor (CMOS) processing, gate contacts are formed over shallow trench isolation (STI) regions. Gate contacts connect a gate line to upper metal layers in device designs. In many instances, providing the gate contacts in STI regions can result is a large amount of chip area being lost.

Gate tie-down structures or regions provide a connection between the gate contact and a source/drain (S/D) region contact. The formation of a gate tie-down structure may result in shorts between a silicide region of the S/D region or with conductive material of an adjacent gate. This is due in part to the small margins of dielectric materials between these structures and the close proximity of the conductive bodies.

SUMMARY

A method for forming a gate tie-down includes opening up a cap layer and recessing gate spacers on a gate structure to expose a gate conductor; forming inner spacers on the gate spacers; etching contact openings adjacent to sides of the gate structure down to a substrate below the gate structures; and forming trench contacts on sides of the gate structure. An interlevel dielectric (ILD) is deposited on the gate conductor and the trench contacts and over the gate structure. The ILD is opened up to expose the trench contact on one side of the gate structure and the gate conductor. A second conductive material is formed to provide a self-aligned contact down to the trench contact on the one side of the gate structure and to form a gate contact down to the gate conductor and to form a horizontal connection within the ILD over an active area between the gate conductor and the self-aligned contact.

Another method for forming a gate tie-down includes opening up a cap layer and recessing gate spacers on a gate structure to expose a gate conductor; forming inner spacers on the gate spacers; etching contact openings adjacent to sides of the gate structure down to a substrate below the gate structure; filling the contact openings with a first conductive material; recessing the first conductive material and the gate conductor below the inner spacers to form trench contacts on sides of the gate structure; depositing an interlevel dielectric (ILD) on the gate conductor and the trench contacts and over other gate structures; opening up the ILD to expose the trench contact on one side of the gate structure and the gate conductor; forming a second conductive material to form a self-aligned contact down to the trench contact on the one side of the gate structure and to form a gate contact down to the gate conductor; and planarizing the second conductive material and the ILD to form a horizontal connection within the ILD over an active area between the gate conductor and the self-aligned contact.

A gate tie-down structure includes a gate structure including a gate conductor and gate spacers, inner spacers formed on the gate spacers and trench contacts formed on sides of the gate structure. A first interlevel dielectric (ILD) is configured to bury the gate structure, and a second interlevel dielectric (ILD) is formed on the first ILD, the second ILD having a thickness. A self-aligned contact connects to the trench contact on one side of the gate structure. A gate contact is connected to the gate conductor. A horizontal connection is formed within the thickness of the second ILD over an active area and connects the gate conductor and the self-aligned contact over one of the inner spacers.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
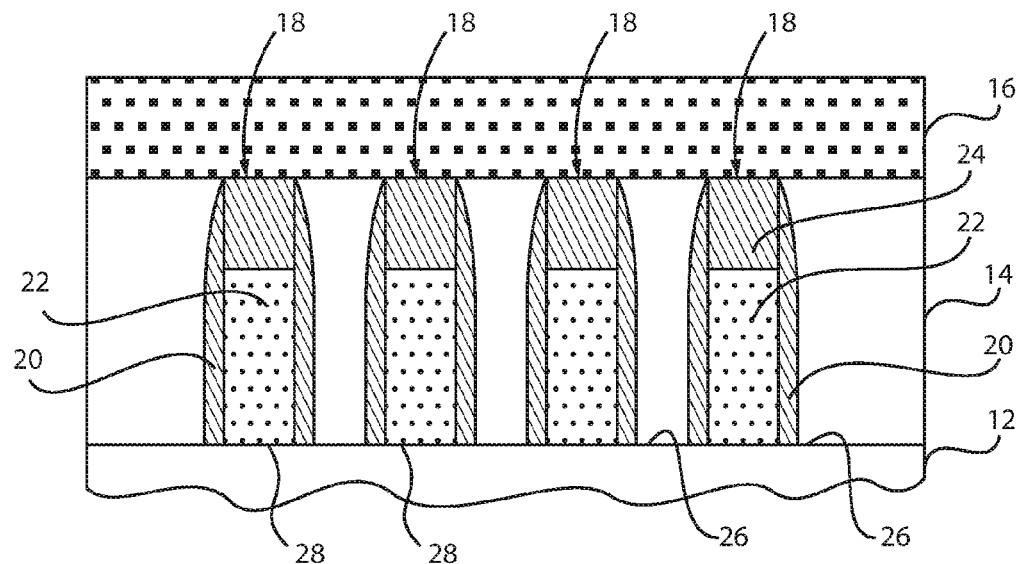
FIG. 1 is a cross-sectional view of a semiconductor device having gate structures formed in an interlevel dielectric (ILD) in accordance with the present principles.

In accordance with the present principles, a gate tie-down structure and methods for fabrication are provided. The gate tie-down provides a gate contact (CB) that is able to short against a self-aligned contact (CA) without shorting against a trench silicide (TS) contact. The gate contact provides a connection to a gate conductor (PC) of a gate structure employed in a transistor device. The gate conductor, in some instances, may be connected to a source or drain region. This is referred to as a gate tie-down. Gate tie-downs in accordance with the present principles may be provided over active regions without suffering from the shorting issues of conventional structures. In addition, the gate tie-downs include a gate contact that is self-aligned to a source/drain contact. The tie-down structure provides a gate contact that can "fly" over the source drain contact making the design more compact and saving precious chip area. For example, the gate tie-down structure can be allowed on or over active areas (AA). The gate contact structure enables the gate contact to fly over a source/drain contact to reduce a layout footprint. The gate tie-down structure may be employed in memory devices, e.g., static random access memory (SRAM), processors, or other chip devices.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be included in an integrated circuit or integrated circuit design. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a partially fabricated semiconductor device 10 is shown in accordance with the present principles. The device 10 is formed on a substrate 12, which may include any suitable substrate materials, such as Si, SiGe, SiC, III-V materials, etc. Gate structures 18 are formed on the substrate 12 and may include source/drain (S/D) regions 26 adjacent to the gates structures 18. The gate structures 18 may include a gate dielectric 28 (e.g., an oxide) and a gate conductor 22, which may include a metal, doped polysilicon or other suitable gate conductor material. Spacers 20 are formed on sidewalls of the gate conductor 22 and a cap layer 24 is formed over the gate conductor 22. The spacers 20 and the cap 24 may include a silicon nitride material, although other dielectric materials may be employed. Gate structures 18 are buried in an interlevel dielectric (ILD) material 14, such as an oxide. Another ILD 16 is formed over the gate structures 18 and on the first ILD 14. The ILD 16 may also include an oxide.

Figure 2:
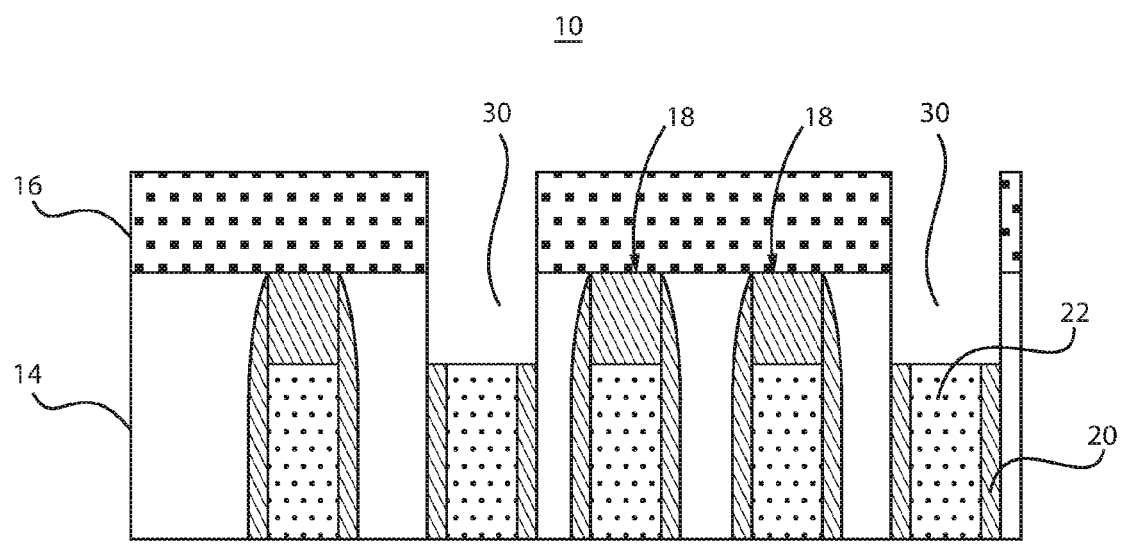
FIG. 2 is a cross-sectional view of the semiconductor device of FIG. 1 having gate structures recessed to expose a gate conductor in accordance with the present principles.

Referring to FIG. 2, recesses 30 are etched through the ILD 14 and ILD 16. The cap layer 24 is removed, and the spacers 20 are recessed to expose the gate conductors 22 for selected gate structures 18. The recesses 30 are formed to gain access to the gate conductors 22 to drop in a gate contact for connecting the gate conductor to upper level metal structures to provide gate control. The recesses 30 are formed by performing a lithographic patterning process followed by an etch process to open the recesses 30 and expose the gate conductors 22. The etch process may include a reactive ion etch (RIE). The recesses 30 allow for a self-aligned contact to be provided as will be described.

Figure 3:
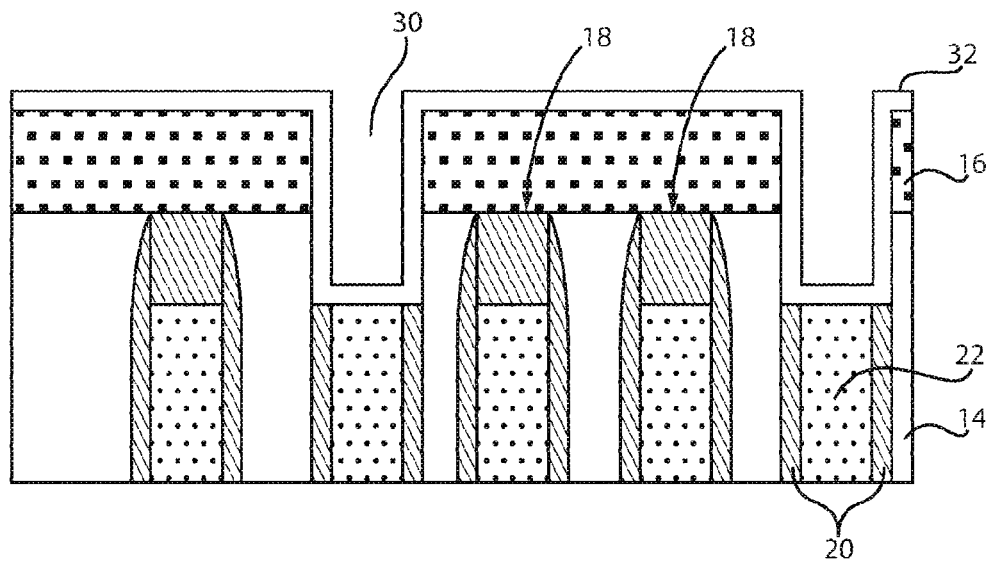
FIG. 3 is a cross-sectional view of the semiconductor device of FIG. 2 showing a spacer layer formed in accordance with the present principles.

Referring to FIG. 3, a spacer dielectric layer 32 is conformally formed on the ILD 16 and in the recesses 30 on sidewalls, and over the spacers 20 and the gate conductors 22. The spacer dielectric layer 32 may include silicon nitride although other materials may be employed, e.g., high-k dielectrics or other high selective etch stop layer (ESL) materials.

Figure 4:
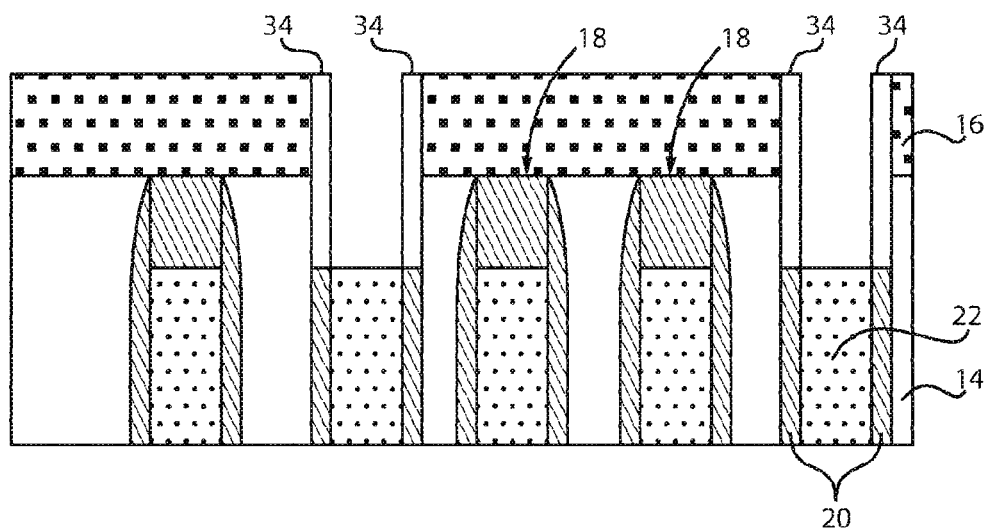
FIG. 4 is a cross-sectional view of the semiconductor device of FIG. 3 showing spacers formed on gate spacers in accordance with the present principles.

Referring to FIG. 4, a directional etch process may be performed to remove the spacer dielectric layer 32 from horizontal surfaces. The directional etch process may include RIE, e.g., employing an etch chemistry including $BCl_3$. The removal of the spacer dielectric layer 32 from the horizontal surfaces forms inner spacers 34.

Figure 5:
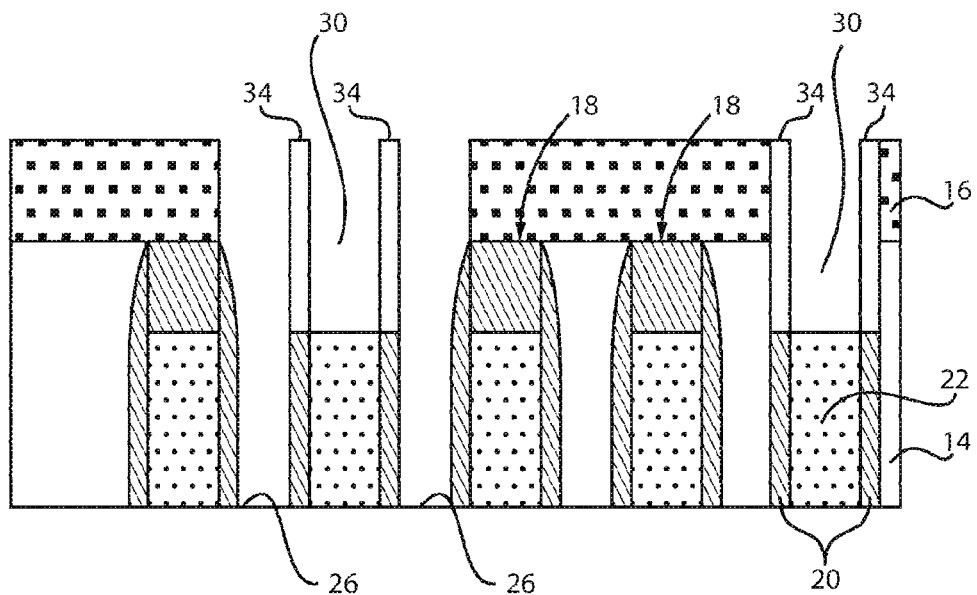
FIG. 5 is a cross-sectional view of the semiconductor device of FIG. 4 showing trench contact holes etched adjacent to the gate spacers in accordance with the present principles.

Referring to FIG. 5, a lithographic patterning process is employed to form a mask for etching the ILD 16 and ILD 14. A RIE is performed to expose S/D regions 26 adjacent to the gate structure 18, which is selected for the formation of a gate tie-down structure. The RIE forms trenches 36. The etch exposes the S/D regions 26 to enable a trench silicide (TS) to be formed. The silicide may be formed on the S/D regions 26 by depositing a metal and annealing to cause a mixing of the metal with material of the S/D regions 26 (to form a silicide).

Figure 6:
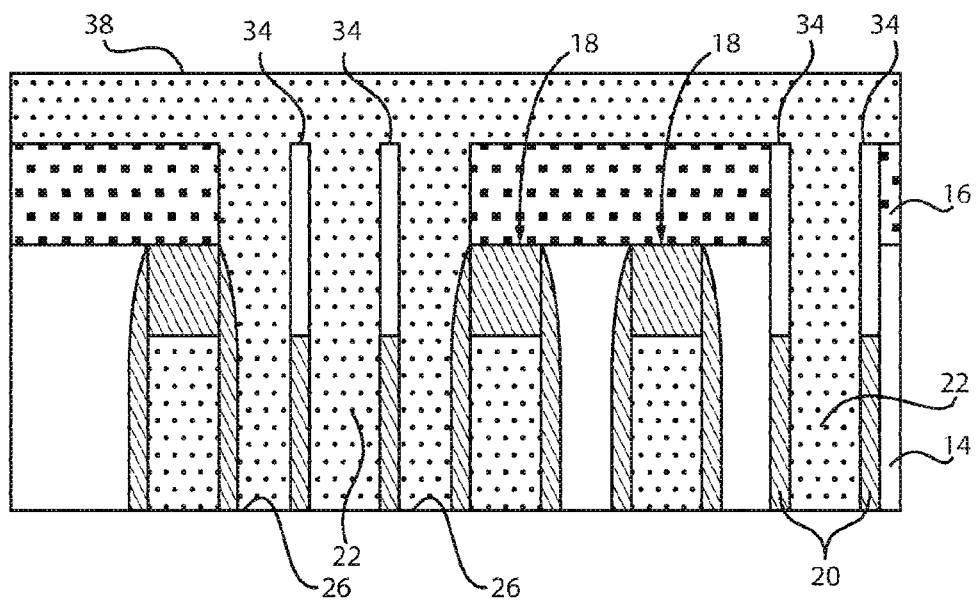
FIG. 6 is a cross-sectional view of the semiconductor device of FIG. 5 showing the trench contact holes filled with conductive material in accordance with the present principles.

Referring to FIG. 6, a deposition process is performed to fill trenches 30 between inner spacers 34 and to fill trenches 36 adjacent to the gate structures 18 with a conductive material 38. The deposition process may include a chemical vapor deposition (CVD) process although other deposition processes may be employed. The conductive material 38 may include W, although other metals may be employed, e.g., Al, Cu, Ag, etc. The conductive material 38 connects with the exposed gate conductors 22 as well as the S/D regions 26. The conductive material 38 preferably includes the same materials as the gate conductors 22.

Figure 7:
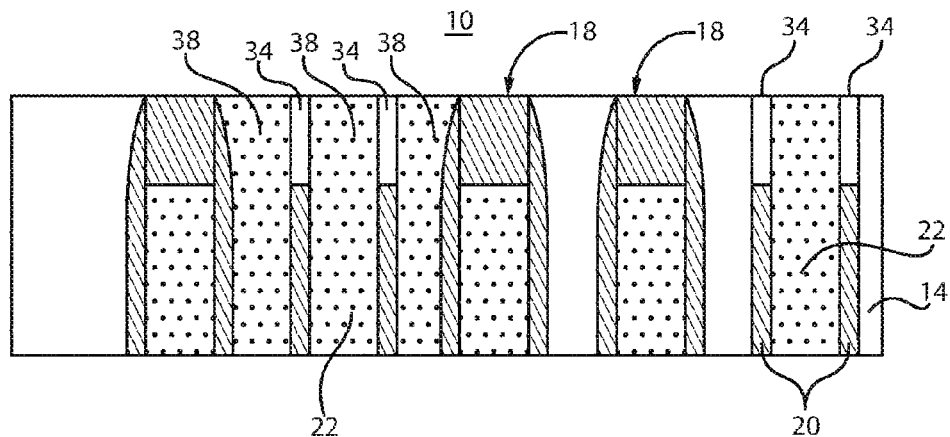
FIG. 7 is a cross-sectional view of the semiconductor device of FIG. 6 showing the conductive material planarized in accordance with the present principles.

Referring to FIG. 7, a planarization process is performed to planarize a top surface of the device 10 to remove excess conductive material 38. The planarization process may include a chemical mechanical polish (CMP) process.

Figure 8:
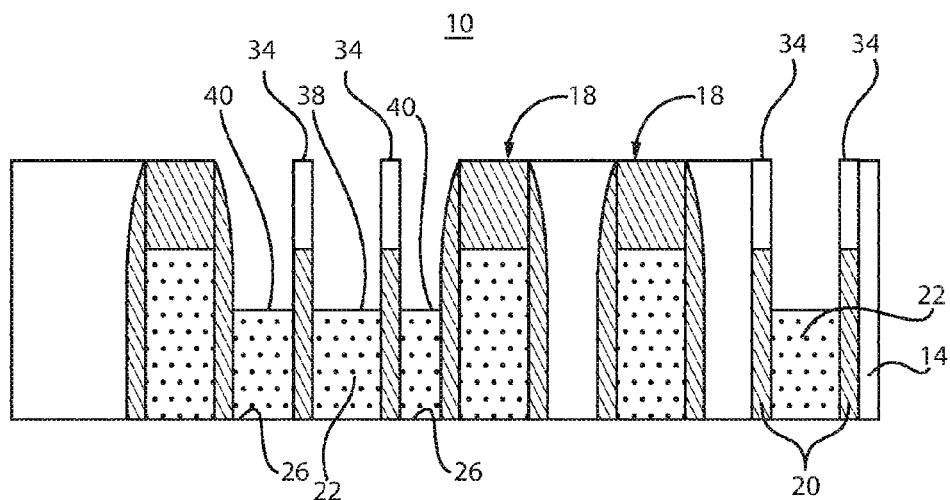
FIG. 8 is a cross-sectional view of the semiconductor device of FIG. 7 showing the conductive material recessed to below the inner spacers in accordance with the present principles.

Referring to FIG. 8, a recess process is performed to recess the conductive material 38 below the inner spacers 34. The recess process may include a RIE process that selectively removes the conductive material 38 relative to the ILD 14, the spacers 20 and the inner spacers 34. In one embodiment, the ILD 16 includes oxide, and the spacers 20 and 34 include nitride. Recessing the conductive material 38 forms trench silicide (TS) contacts 40, which contact the S/D regions 26. The planarization process may include a chemical mechanical polish (CMP) process.

Figure 9:
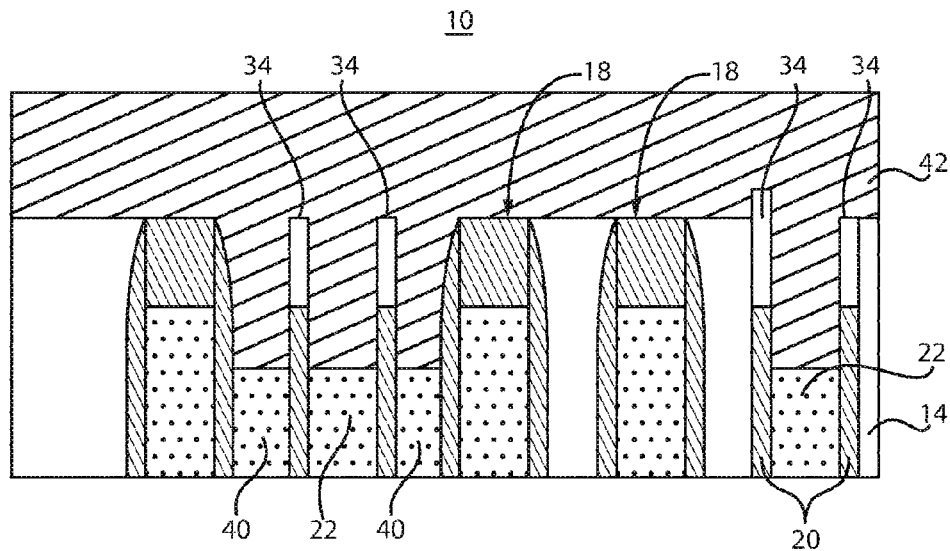
FIG. 9 is a cross-sectional view of the semiconductor device of FIG. 8 showing another ILD formed in recessed regions below the inner spacers in accordance with the present principles.

Referring to FIG. 9, another ILD 42 is deposited on the device 10. The ILD 42 may include an oxide although other dielectric materials may be employed. The ILD 42 fills down to the TS contacts 40 and the gate conductors 22. An ILD planarization process (e.g., CMP) may be performed to planarize the ILD 42 on a top surface of the device. The planarization process may not be needed.

Figure 10:
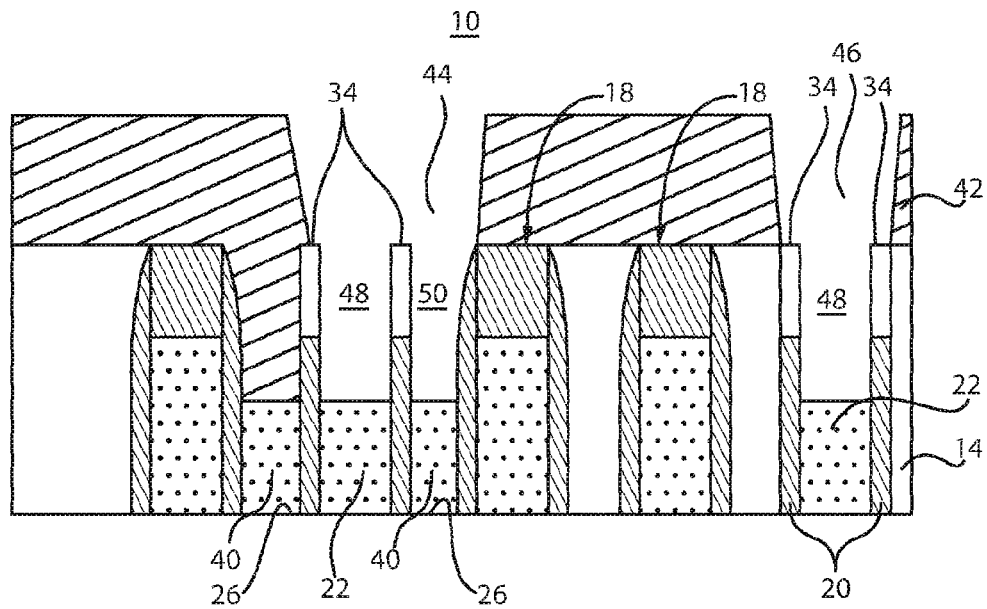
FIG. 10 is a cross-sectional view of the semiconductor device of FIG. 9 showing the ILD etched to expose one trench contact and the gate conductor below the inner spacers in accordance with the present principles.

Referring to FIG. 10, an open process is employed to open up a gate tie-down structure. Etching processes are employed to remove the ILD 42 in areas defined by lithographic techniques. Regions 48 are opened up by removing the ILD 42 between the inner spacers 34 and spacers 20 to expose the gate conductor 22. Regions 50 are opened up by removing the ILD 42 to expose a TS contact 40. Other TS contacts 40 may be opened up at different locations along a line of the gate structures 18.

In one embodiment, the etching process to remove ILD 42 includes a lithography, etch, lithography, etch (LELE) process. This may include a self-aligned contact (CA) lithography followed by an etch to open up region 44 over region 50. Then, a self-aligned gate contact (CB) lithography is performed followed by an etch to open up region 44 over region 48. The etching processes preferably include RIE, although other etching techniques may be employed.

In another embodiment, a lithography, freeze, lithography, etch (LFLE) process may be employed. First, a CA lithography is performed to pattern the ILD 42 for a contact in region 50, but before etching a first resist material is chemically frozen and a second lithography process is performed by depositing a second resist. The second resist is for etching the regions 48 for the gate contacts (CB). Then, an etch is performed to remove the ILD 42 as shown in FIG. 10 in accordance with both the first and second resist patterns. The etching process preferably includes RIE, although other etching techniques may be employed.

In another embodiment, an extreme ultraviolet (EUV) lithography process may be employed where a same color lithography is performed for both the CA and CB patterning. The etch mask is formed and then etched to concurrently form the CA and CB contacts openings in regions 48 and 50, respectively. The etching process preferably includes RIE, although other etching techniques may be employed.

The etching processes described (e.g., LELE, LFLE and EUV) are all performed with a high selectivity between material ILD 42 (e.g., oxide) and the material of spacers 22 and inner spacers 34 (e.g., nitride).

Figure 11:
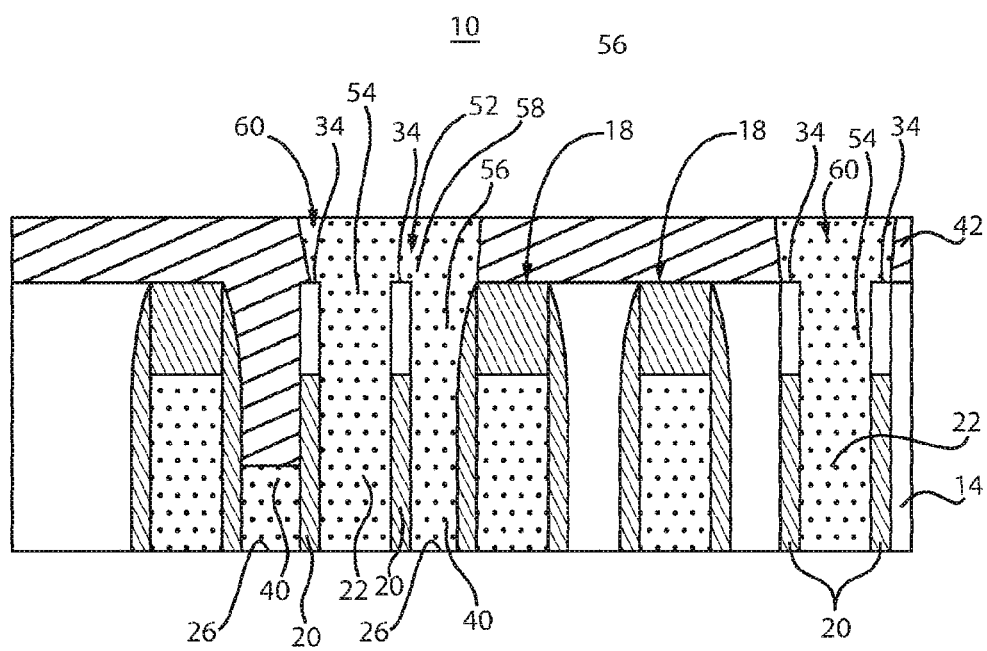
FIG. 11 is a cross-sectional view of the semiconductor device of FIG. 10 showing a conductive material deposition, and the conductive material and the ILD planarized to form a gate tie-down structure with a gate contact, a connection (in the ILD) and self-aligned contact in accordance with the present principles.

Referring to FIG. 11, a deposition process is performed to deposit a conductive material 60 to form gate contacts 54 (CB), contacts 56 (CA), and a gate tie-down structure 52. The conductive material 60 preferably includes a same material as employed for TS contacts 40 and gate conductor 22. In one embodiment, the conductive material 60 includes W, although other metals may be employed. The conductive material 60 is planarized to recess the material 60 such that a portion of the conductive material 60 forms a connection between the gate contact 54 and the contact 56 (that connects to the TS contact 40).

In accordance with the present principles, the gate tie-down structure 52 provides a self-aligned gate contact 54 that shorts directly to contact 56 (S/D contact) and not directly to the TS contact 40. The spacers 20 and inner spacer 34 provide a dielectric barrier that prevents direct shorting between the gate contact 54 and the TS contact 40. In addition, the gate contact 54 is self-aligned with the S/D contact 56. The gate contact 54 is made within the active region (over S/D regions 26). This reduces the layout footprint of the device 10. In other words, a horizontal connection 58 is made over the inner spacers 34 directly between the gate contact 54 and the self-aligned contact 56 using vertical space provided by the ILD 42. This connection 58 is made without having to use layout area, which would normally be consumed by placing the connections over an STI region outside of the S/D regions (active area). The present principles may be implemented in 7 nm technology, although other technology sizes (larger or smaller) may benefit from the present principles.

Figure 12:
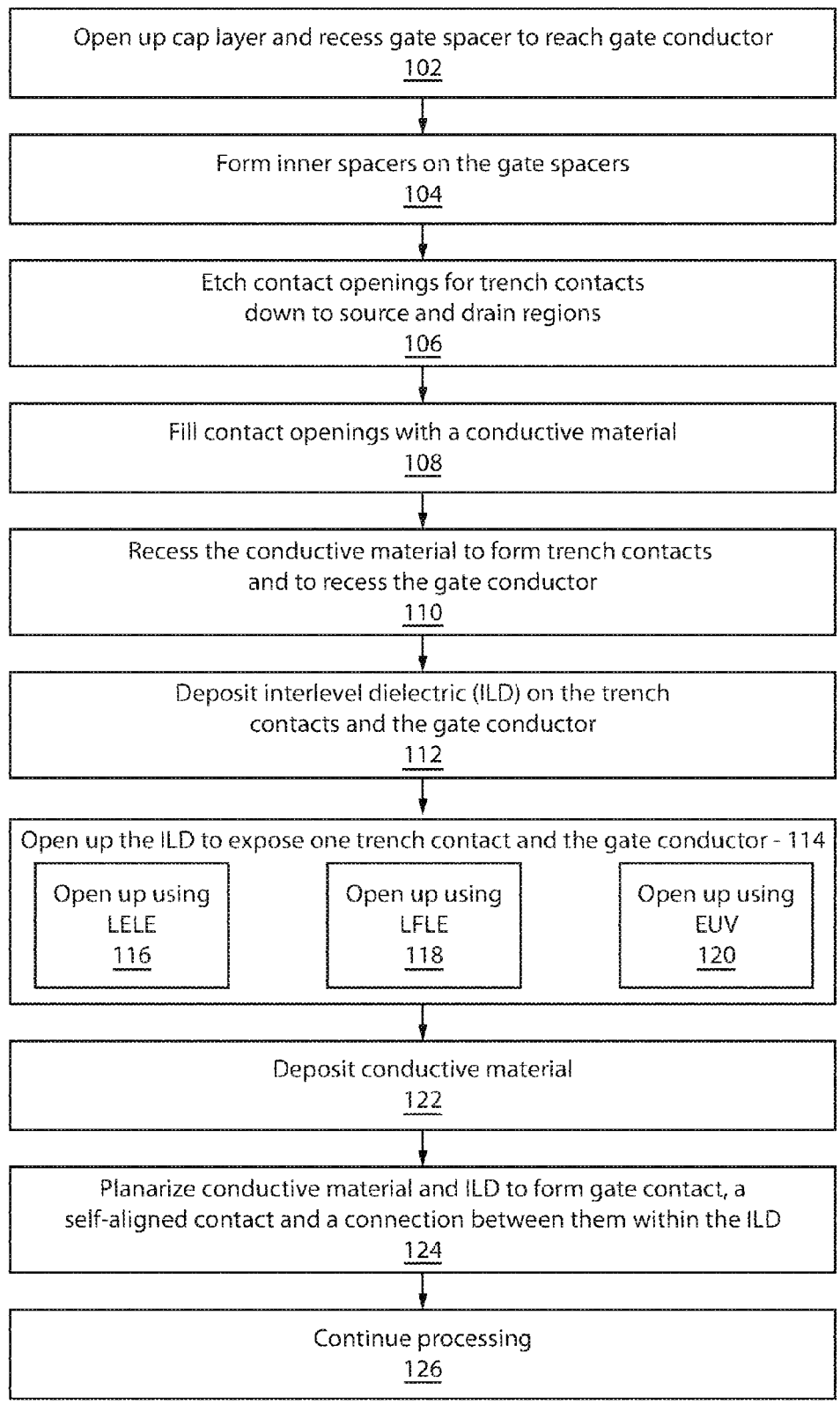
FIG. 12 is a block/flow diagram showing methods for forming a gate tie-down in accordance with the present principles.

Referring to FIG. 12, methods for forming a gate tie-down are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, after gate structures and source and drain (S/D) regions are formed, a cap layer may be opened up and gate spacers recessed on a gate structure to expose a gate conductor. This is performed by employing a lithographic patterning process and etch, e.g., by RIE. In block 104, inner spacers are formed on the gate spacers. This may include depositing a spacer layer (e.g., nitride) followed by a spacer etch (e.g., RIE). In block 106, contact openings are etched adjacent to sides of the gate structure down to a substrate below the gate structures. These openings expose the S/D regions for the formation of trench contacts (TS). In block 108, the contact openings are filled with a first conductive material. In block 110, the first conductive material and the gate conductor are recessed below the inner spacers to form trench contacts on sides of the gate structure. In block 112, an interlevel dielectric (ILD) is deposited on the gate conductor and the trench contacts and over the gate structure (e.g., on an ILD which buries the gate structures up to the cap layer).

In block 114, the ILD is opened up to expose the trench contact on one side of the gate structure and the gate conductor. In block 116, opening up the ILD may include performing a lithography, etch, lithography, etch (LELE) procedure wherein one lithography and etch forms a contact hole for the self-aligned contact and the other lithography and etch forms a contact hole for the gate contact. In block 118, opening up the ILD may include performing a lithography, freeze, lithography, etch (LFLE) procedure wherein one lithography forms a contact hole pattern for the self-aligned contact, which is frozen, and the other lithography forms a contact hole pattern for the gate contact before etching with both patterns. In block 120, opening up the ILD may include performing an extreme ultraviolet (EUV) lithography using a same color lithography to form patterns for the gate contact and the self-aligned contact before etching.

In block 122, a second conductive material is formed to provide a self-aligned contact down to the trench contact on the one side of the gate structure and to form a gate contact down to the gate conductor. In block 124, the second conductive material and the ILD are planarized to form a horizontal connection within the ILD over an active area between the gate conductor and the self-aligned contact. The ILD includes a thickness above a cap layer of gate structures and the horizontal connection is formed within the ILD thickness. The gate spacers and the inner spacers permit contact between the self-aligned contact and the gate contact and prevent contact between the trench contact and the gate conductor. The gate contact is self-aligned to the trench contact. In block 126, processing continues to complete the device.

Having described preferred embodiments for gate tie-down enablement with an inner spacer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a gate tie-down, comprising:
    forming inner spacers on gate spacers of a gate structure;
    concurrently forming trench contacts on sides of the gate structure and exposing a gate conductor in the gate structure; and
    forming a conductive material in an opening through an interlevel dielectric (ILD) to provide a self-aligned contact down to the trench contact on one side of the gate structure and to form a gate contact down to the gate conductor and a horizontal connection within the ILD between the gate conductor and the self-aligned contact.

2. The method as recited in claim 1, wherein the gate spacers and the inner spacers permit contact between the self-aligned contact and the gate contact and prevent contact between the trench contact on one side of the gate structure and the gate conductor.

3. The method as recited in claim 1, wherein the forming the conductive material further includes forming the ILD on the gate conductor and the trench contacts and over other gate structures.

4. The method as recited in claim 3, wherein the forming the conductive material further includes opening up the ILD to expose the trench contact on the one side of the gate structure and the gate conductor.

5. The method as recited in claim 4, wherein opening up the ILD includes performing a lithography, etch, lithography, etch (LELE) procedure wherein one lithography and etch forms a contact hole for the self-aligned contact and the other lithography and etch forms a contact hole for the gate contact.

6. The method as recited in claim 4, wherein opening up the ILD includes performing a lithography, freeze, lithography, etch (LFLE) procedure wherein one lithography forms a contact hole pattern for the self-aligned contact, which is frozen, and the other lithography forms a contact hole pattern for the gate contact before etching.

7. The method as recited in claim 4, wherein opening up the ILD includes performing an extreme ultraviolet (EUV) lithography using a same color lithography to form patterns for the gate contact and the self-aligned contact before etching.

8. The method as recited in claim 1, wherein the gate contact is self-aligned to the trench contact on one side of the gate structure.

9. The method as recited in claim 1, further comprising opening up a cap layer to expose the gate conductor.

10. The method as recited in claim 9, wherein the ILD includes a thickness above the cap layer of gate structures and the horizontal connection is formed within the thickness of the ILD.

11. A method for forming a gate tie-down, comprising:
    recessing gate spacers on a gate structure to expose a gate conductor;
    exposing trench contacts on sides of the gate structure;
    forming a conductive material in an opening through an interlevel dielectric (ILD) to form a self-aligned contact down to a trench contact on one side of the gate structure and to form a gate contact down to the gate conductor; and planarizing the conductive material and the ILD to form a horizontal connection within the ILD over an active area between the gate conductor and the self-aligned contact.

12. The method as recited in claim 11, wherein the gate spacers and inner spacers formed on the gate spacers permit contact between the self-aligned contact and the gate contact and prevent contact between the trench contact and the gate conductor.

13. The method as recited in claim 11, wherein the forming the conductive material further includes depositing the ILD on the gate conductor and over the gate structure.

14. The method as recited in claim 13, wherein the forming the conductive material further includes opening the ILD to expose the trench contact on the one side of the gate structure and the gate conductor.

15. The method as recited in claim 14, wherein opening up the ILD includes performing a lithography, etch, lithography, etch (LELE) procedure wherein one lithography and etch forms a contact hole for the self-aligned contact and the other lithography and etch forms a contact hole for the gate contact.

16. The method as recited in claim 14, wherein opening up the ILD includes performing a lithography, freeze, lithography, etch (LFLE) procedure wherein one lithography forms a contact hole pattern for the self-aligned contact, which is frozen, and the other lithography forms a contact hole pattern for the gate contact before etching.

17. The method as recited in claim 14, wherein opening up the ILD includes performing an extreme ultraviolet (EUV) lithography using a same color lithography to form patterns for the gate contact and the self-aligned contact before etching.

18. The method as recited in claim 14, wherein the gate contact is self-aligned to the trench contact.

19. The method as recited in claim 11, further comprising opening up a cap layer to expose the gate conductor.

20. The method as recited in claim 19, wherein the ILD includes a thickness above the cap layer of the gate structure and the horizontal connection is formed within the thickness of the ILD.

* * * * *